United States Patent
Hayata et al.

(10) Patent No.: US 11,495,289 B2
(45) Date of Patent: Nov. 8, 2022

(54) NEURAL NETWORK COMPUTATION CIRCUIT INCLUDING SEMICONDUCTOR MEMORY ELEMENT, AND METHOD OF OPERATION

(71) Applicant: PANASONIC CORPORATION, Osaka (JP)

(72) Inventors: Yuriko Hayata, Osaka (JP); Kazuyuki Kouno, Osaka (JP); Masayoshi Nakayama, Kyoto (JP); Reiji Mochida, Osaka (JP); Takashi Ono, Osaka (JP); Hitoshi Suwa, Osaka (JP)

(73) Assignee: PANASONIC HOLDINGS CORPORATION, Osaka (JP)

( * ) Notice: Subject to any disclaimer, the term of this patent is extended or adjusted under 35 U.S.C. 154(b) by 409 days.

(21) Appl. No.: 16/809,365

(22) Filed: Mar. 4, 2020

(65) Prior Publication Data

US 2020/0202925 A1    Jun. 25, 2020

Related U.S. Application Data

(63) Continuation of application No. PCT/JP2018/031298, filed on Aug. 24, 2018.

(30) Foreign Application Priority Data

Sep. 7, 2017 (JP) .............................. JP2017-171953

(51) Int. Cl.
*G11C 16/06* (2006.01)
*G11C 11/54* (2006.01)
(Continued)

(52) U.S. Cl.
CPC ............ *G11C 11/54* (2013.01); *G06F 7/5443* (2013.01); *G06N 3/063* (2013.01); *G06N 3/08* (2013.01); *G11C 7/18* (2013.01); *G11C 16/08* (2013.01)

(58) Field of Classification Search
CPC ........... G11C 11/54; G11C 7/18; G11C 16/08; G11C 13/0026; G11C 7/1006
(Continued)

(56) References Cited

U.S. PATENT DOCUMENTS

| 4,988,891 A | * | 1/1991 | Mashiko | .............. G06N 3/0675 326/38 |
| 5,058,180 A | * | 10/1991 | Khan | ....................... G06N 3/04 706/20 |
| 2015/0254551 A1 | | 9/2015 | Rivera et al. | |

FOREIGN PATENT DOCUMENTS

| JP | 2015-534172 A | 11/2015 |
| WO | 2014/041443 A1 | 3/2014 |

OTHER PUBLICATIONS

Extended European Search Report dated Oct. 1, 2020 issued in the corresponding European Patent Application No. 18853797.1.
(Continued)

*Primary Examiner* — Tha-O H Bui
(74) *Attorney, Agent, or Firm* — McDermott Will & Emery LLP

(57) ABSTRACT

Connection weight coefficients to be used in a neural network computation are stored in a memory array. A word line drive circuit drives a word line corresponding to input data of a neural network. A column selection circuit connects to a computation circuit bit lines to which a connection weight coefficient to be computed is connected. The computation circuit determines the sum of cell currents flowing in the bit lines. A result of the determination made by the computation circuit is stored in an output holding circuit, and is set as an input of a neural network in the next layer, to the word line drive circuit. A control circuit instructs the word line drive circuit and the column selection circuit to select the word line and the bit line to be used in the neural network
(Continued)

computation, based on information held in a network configuration information holding circuit.

6 Claims, 11 Drawing Sheets

(51) Int. Cl.
    *G06F 7/544*     (2006.01)
    *G06N 3/063*     (2006.01)
    *G06N 3/08*     (2006.01)
    *G11C 7/18*     (2006.01)
    *G11C 16/08*     (2006.01)

(58) Field of Classification Search
    USPC .................................................. 365/185.21
    See application file for complete search history.

(56) References Cited

OTHER PUBLICATIONS

International Search Report and Written Opinion dated Nov. 27, 2018 in International Application No. PCT/JP2018/031298; with partial English translation.

M. Prezioso, et al., "Training and operation of an integrated neuromorphic network based on metal-oxide memristors", Nature, May 7, 2015; vol. 521, pp. 61-64.

Fang Su, et al., "A 462GOPs/J RRAM-Based Nonvolatile Intelligent Processor for Energy Harvesting IoE System Featuring Nonvolatile Logics and Processing-In-Memory," 2017 Symposium on VLSI Circuits Digest of Technical Papers, 2017, pp. C260-C261.

\* cited by examiner

| LAYER | NODE COUNT | START ADDRESS FOR ASSIGNING CONNECTION WEIGHT COEFFICIENT TO NEXT LAYER |
|---|---|---|
| 1 | N1 | WORD LINE START ADDRESS: NUMBER A<br>BIT LINE START ADDRESS: NUMBER B |
| 2 | N2 | WORD LINE START ADDRESS: NUMBER C<br>BIT LINE START ADDRESS: NUMBER D |
| ... | ... | ... |
| N−1 | Nn−1 | WORD LINE START ADDRESS: NUMBER E<br>BIT LINE START ADDRESS: NUMBER F |
| N | Nn | − |

| LAYER | NODE COUNT | START ADDRESS FOR ASSIGNING CONNECTION WEIGHT COEFFICIENT TO NEXT LAYER |
|---|---|---|
| 1 | 8 | WORD LINE START ADDRESS: NUMBER 0 |
| | | BIT LINE START ADDRESS: NUMBER 0 |
| 2 | 16 | WORD LINE START ADDRESS: NUMBER 0 |
| | | BIT LINE START ADDRESS: NUMBER 2 |
| 3 | 8 | — |

NEURAL NETWORK COMPUTATION CIRCUIT INCLUDING SEMICONDUCTOR MEMORY ELEMENT, AND METHOD OF OPERATION

CROSS REFERENCE TO RELATED APPLICATIONS

This application is a U.S. continuation application of PCT International Patent Application Number PCT/JP2018/031298 filed on Aug. 24, 2018, claiming the benefit of priority of Japanese Patent Application Number 2017-171953 filed on Sep. 7, 2017, the entire contents of which are hereby incorporated by reference.

BACKGROUND

1. Technical Field

The present invention relates to a neural network computation circuit including a non-volatile semiconductor memory element, which enables low power consumption and large-scale integration, and to a method of operation for the neural network computation circuit.

2. Description of the Related Art

With the progress of information and communication technology, the advent of Internet of Things (IoT) technology, which enables everything to connect to the Internet, has been attracting attention. Although, in the IoT technology, connecting various electronic devices to the Internet is expected to improve the device performance, artificial intelligence (AI) technology in which electronic devices perform self-learning and self-determination has been actively researched and developed as technology for further improving the device performance in recent years.

In the AI technology, a neural network technique is used that imitates human brain information processing in an engineering manner, and semiconductor integrated circuits that perform a neural network computation at high speed and with low power consumption have been actively researched and developed.

A neural network includes basic elements referred to as neurons (sometimes referred to as perceptrons) connected by junctions referred to as synapses with inputs each of which has a different connection weight coefficient. By the neurons being connected to each other, the neural network executes advanced computation processing, such as image recognition and voice recognition. A neuron performs a multiply-accumulate operation that computes the product of each input and each connection weight coefficient and adds all the products.

Non Patent Literature (NPL) 1 (M. Prezioso, et al., "Training and operation of an integrated neuromorphic network based on metal-oxide memristors," Nature, no. 521, pp. 61-64, 2015) discloses an example of a neural network computation circuit including variable resistance non-volatile memories. The neural network computation circuit includes variable resistance non-volatile memories capable of setting analog resistance values (conductances). The neural network computation circuit stores analog resistance values (conductances) equivalent to connection weight coefficients in non-volatile memory elements. The neural network computation circuit applies analog voltage values equivalent to inputs to the non-volatile memory elements, and at the same time uses analog current values flowing in the non-volatile memory elements. In a multiply-accumulate operation performed by a neuron, connection weight coefficients are stored as analog resistance values (conductances) in non-volatile memory elements, analog voltage values equivalent to inputs are applied to the non-volatile memory elements, and an analog current value that is the sum of current values flowing in the non-volatile memory elements is obtained as a result of the multiply-accumulate operation. The neural network computation circuit including the non-volatile memory element enables low power consumption, and recent years have seen active process development, device development, and circuit development for a variable resistance non-volatile memory capable of setting an analog resistance value (conductance).

Patent Literature (PTL) 1 (Japanese Unexamined Patent Application Publication (Translation of PCT Application) No. 2015-534172) proposes a neural core circuit that stores neuron information in a memory device and is capable of configuring a neural network. In the neural core circuit, synapse connectivity information, neuron parameters, and routing data of a neuron are held in the memory device, and a firing event in a neuron core is routed to another neuron core according to the routing data.

SUMMARY

However, since the neural core disclosed in PTL 1 configures a neural network having any given number of layers and any given number of nodes, cores need to be connected. For this reason, core-connecting circuits need to be mounted for one chip, and a circuit size increases in proportion to an increase in the size of a neural network. Besides, since the number of mountable neurons is determined based on the size of peripheral circuitry, it is difficult to achieve large-scale integration of neurons.

A neural network computation circuit including a semiconductor memory element of the present invention includes: a plurality of word lines; a plurality of bit lines arranged to cross the plurality of word lines; a plurality of memory cells that are disposed at cross points of the plurality of word lines and the plurality of bit lines, the plurality of memory cells each holding a connection weight coefficient of a neural network; a word line drive circuit capable of driving at least one of the plurality of word lines; a column selection circuit capable of selecting a bit line from among the plurality of bit lines; a computation circuit that determines a current flowing in the bit line selected by the column selection circuit, to perform a multiply-accumulate operation between the connection weight coefficients held in the plurality of memory cells connected to the bit line selected by the column selection circuit and input data indicated by drive states of the plurality of word lines; an output holding circuit that holds output data of the computation circuit; a network configuration information holding circuit that holds network configuration information including address information of each memory cell to which the connection weight coefficient of the neural network is assigned; and a control circuit having a function of setting to the word line drive circuit input data from an outside based on the network configuration information, a function of setting to the word line drive circuit data held in the output holding circuit, based on the network configuration information, and a function of specifying to the column selection circuit a bit line to be used for a computation, based on the network configuration information.

The control circuit sets input data of an input layer to the word line drive circuit by reference to network configuration information. In addition, the control circuit selects a bit line by reference to the network configuration information, and connects the bit line to the computation circuit. The computation circuit outputs a result of a neural network computation, based on a cell current of a memory cell driven by the word line drive circuit flowing in the selected bit line. Since it is not possible to obtain all outputs in a single operation of computation circuits when the number of the computation circuits is greater than the number of output nodes, a selected bit line is changed, and a computation is performed again using a different memory cell. A computational result of a layer is held in the output holding circuit. After all outputs become available, the computation result is set as an input of the next layer, to the word line drive circuit, by reference to the network configuration information. After a computation operation is repeated as many times as the number of layers according to the network configuration information, data of an output layer are outputted from the output holding circuit, and a neural network computation operation is completed.

The present invention makes it possible to set again a computational result in a layer as an input of the next layer to a word line of a memory array by managing placement of connection weight coefficients within the memory array based on network configuration information, and to perform a computation for a neural network having layers, using one memory array. Further, the present invention makes it possible to rewrite network configuration information to configure different neural networks using the same memory array. In addition, since a memory array and a computation circuit are separated by a column selection circuit, the present invention makes it possible to highly integrate memory cells holding connection weight coefficients, and dramatically increase the number of neurons to be mounted on a circuit.

By virtue of the advantageous effects mentioned above, it is possible to provide a neural network computation circuit including a non-volatile semiconductor memory element, which covers a small area and achieves a computation of a neural network including many neurons and layers, using one memory array.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENT(S)

Hereinafter, embodiments of the present invention will be described with reference to the drawings.

[Neural Network Computation]

First, the following describes the basic theory of neural network computation.

Figure 1:
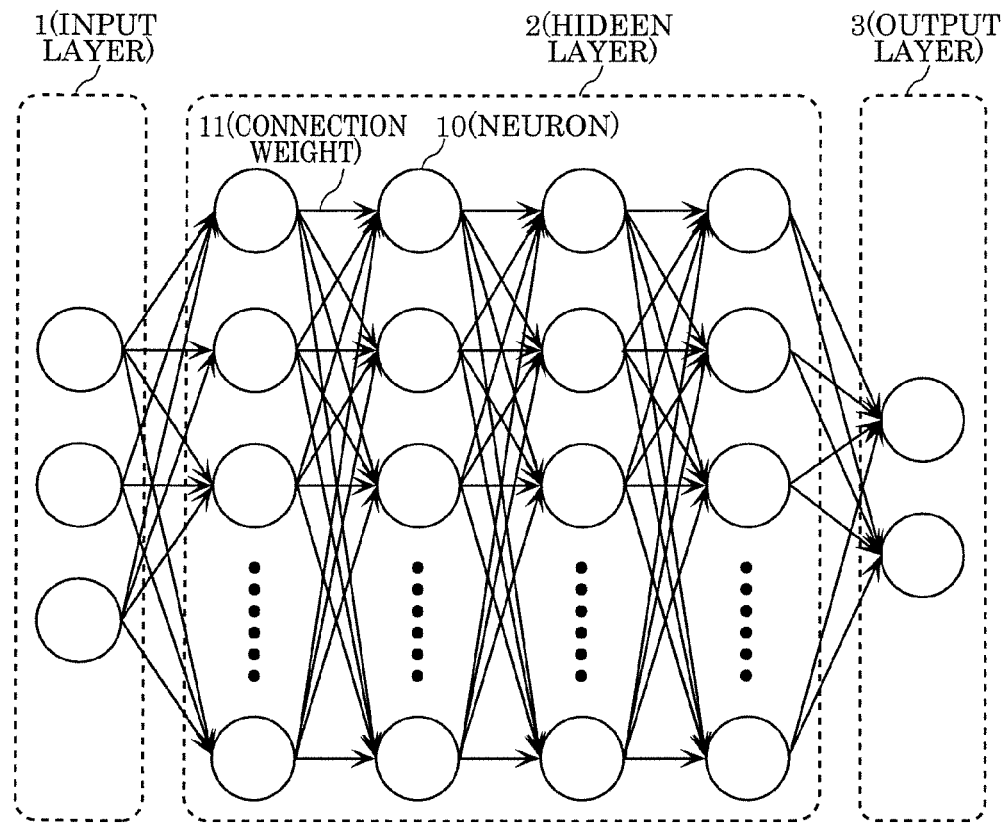
FIG. 1 is a diagram illustrating a configuration example of a neural network, especially a deep neural network.

FIG. 1 is a diagram illustrating a configuration of a deep neural network. A neural network includes: input layer 1 to which input data are inputted; hidden layer 2 (sometimes referred to as a middle layer) that receives the input data of input layer 1 and performs a computation; and output layer 3 that receives output data of hidden layer 2 and performs a computation. In each of input layer 1, hidden layer 2, and output layer 3, there are many basic elements of the neural network referred to as neurons 10, and each neuron 10 is connected to other neurons 10 via connection weights 11. Connection weights 11, each of which has a different connection weight coefficient, connect the neurons. Neuron 10 receives input data, performs a multiply-accumulate operation between the input data and corresponding connection weight coefficients, and outputs a result of the multiply-accumulate operation as output data. Here, in the sense that hidden layer 2 includes connected columns (four columns in FIG. 1) of neurons, which forms a deep neural network, the neural network illustrated in FIG. 1 is referred to as a deep neural network.

Figure 2:
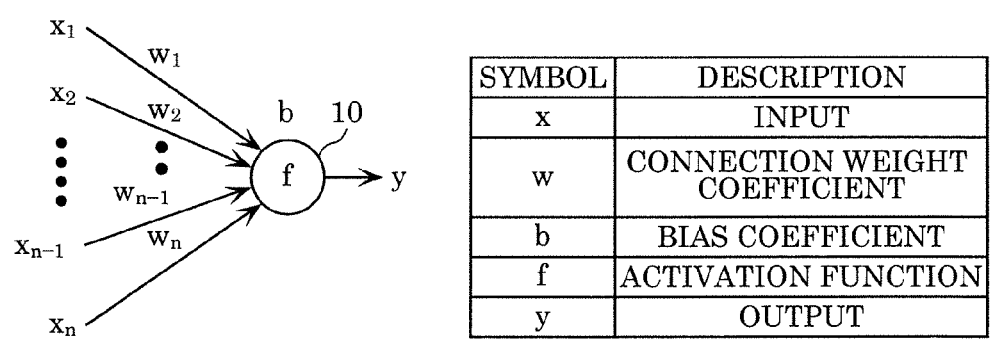
FIG. 2 is a diagram illustrating a calculation performed by a neuron in a neural network computation.

FIG. 2 is a diagram illustrating a calculation performed by a neuron in a neural network computation. The calculation performed by neuron 10 is expressed by equation (1) and equation (2) in FIG. 2. Neuron 10 is connected to n inputs $x_1$ to $x_n$ via connection weights each having a corresponding one of connection weight coefficients $w_1$ to $w_n$, and performs a multiply-accumulate operation between inputs $x_1$ to $x_n$ and connection weight coefficients $w_1$ to $w_n$. Neuron 10 has bias coefficient b and adds bias coefficient b to a result of the multiply-accumulate operation between inputs $x_1$ to $x_n$ and connection weight coefficients $w_1$ to $w_n$. Neuron 10 has activation function f and performs a computation on a result obtained by adding bias coefficient b to the result of the multiply-accumulate operation between inputs $x_1$ to $x_n$ and connection weight coefficients $w_1$ to $w_n$, using activation function f, to output output y.

Figure 3:
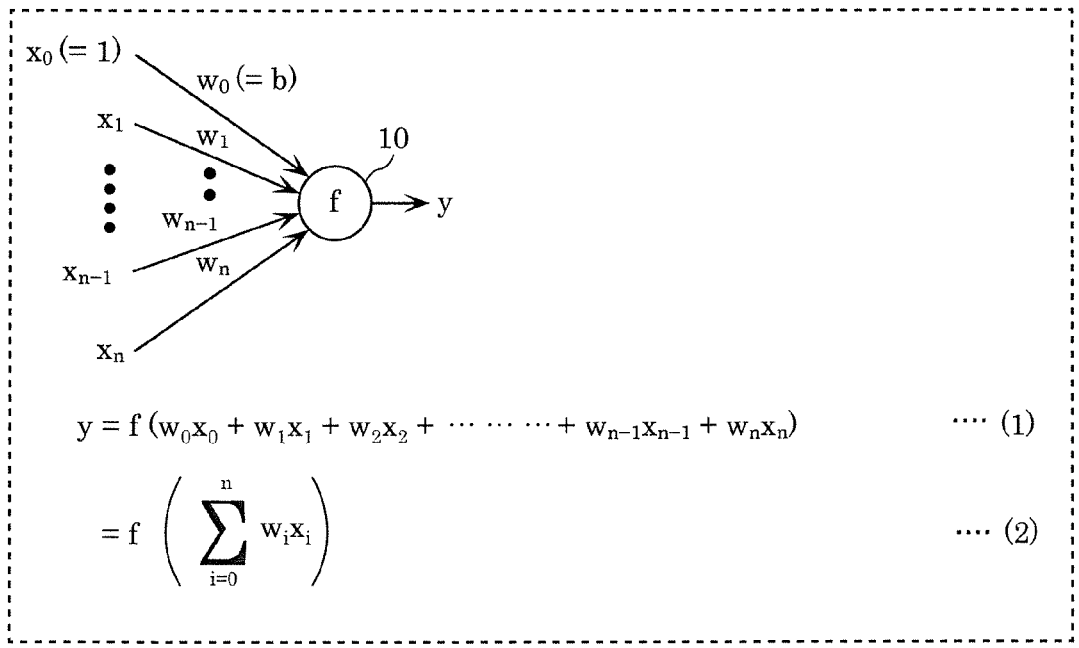
FIG. 3 is a diagram illustrating a calculation performed by a neuron in a neural network computation in view of a calculation of a bias in the present invention.

FIG. 3 is a diagram illustrating a case in which a computation of bias coefficient b is assigned to input x0 and connection weight coefficient w0 in a calculation performed by a neuron in a neural network computation. The calculation performed by neuron 10 is expressed by equation (1) and equation (2) in FIG. 3. Neuron 10 performs the multiply-accumulate operation between inputs $x_1$ to $x_n$ and connection weight coefficients $w_1$ to $w_n$ and adds bias coefficient b in FIG. 2. However, as illustrated in FIG. 3, by assigning the addition of bias coefficient b to input $x_0=1$ and connection weight coefficient w0=b, it is possible to interpret that neuron 10 is connected to n+1 inputs $x_0$ to $x_n$ via connection weights each having a corresponding one of connection weight coefficients $w_0$ to $w_n$. As shown by equation (1) and equation (2) in FIG. 3, the calculation performed by neuron 10 can be concisely expressed by only the sum of products between inputs $x_0$ to $x_n$ and connection weight coefficients $w_0$ to $w_n$. In the present embodiment, as illustrated in FIG. 3, the addition of bias coefficient b is expressed as input $x_0=1$ and connection weight coefficient $w_0=b$.

Figure 4:
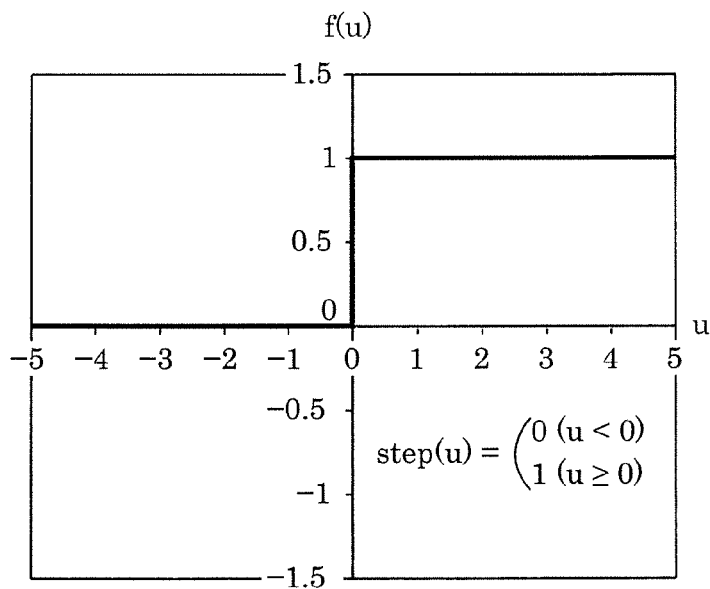
FIG. 4 is a diagram illustrating a step function that is an example of an activation function.

FIG. 4 is a diagram illustrating activation function f for a neuron in neural network computation according to the embodiment. The x axis indicates input u of activation function f, and the y axis indicates output f(u) of activation function f. As illustrated in FIG. 4, the step function outputs output f(u)=0 when input u is a negative value (<0), and outputs output f(u)=1 when input u is a positive value (≥0). When neuron 10 illustrated in FIG. 3 uses activation function f of the step function, neuron 10 outputs output y=0 when a result of a multiply-accumulate operation between inputs $x_0$ to $x_n$ and connection weight coefficients $w_0$ to $w_n$ is a negative value, and outputs output y=1 when the result of the multiply-accumulate operation is a positive value.

Although the step function is used as an example of the activation function from this point forward, examples of the activation function used in a neural network computation include a linear function, and the activation function in the present invention is not limited to the step function.

[Neural Network Computation Circuit]

Figures 5, 6:
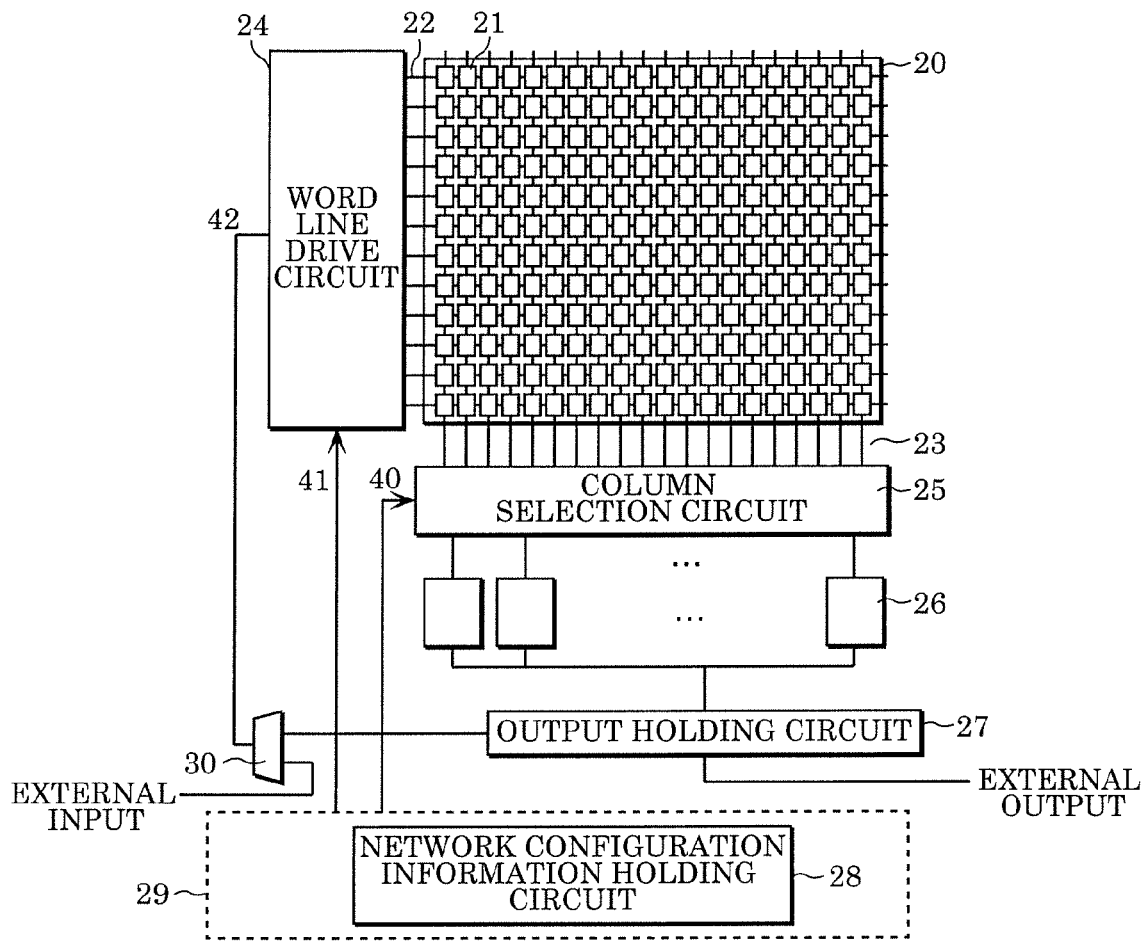
FIG. 5 is a diagram illustrating Embodiment 1.
FIG. 6 is a diagram illustrating a configuration example of network configuration information.

FIG. 5 is a diagram illustrating a detailed configuration of a neural network computation circuit including a non-volatile semiconductor memory element according to Embodiment 1.

Memory cells 21 are arranged in rows and columns to form memory cell array 20. Memory cells 21 are connected to word lines 22 disposed horizontally and bit lines 23 disposed vertically. A memory cell includes a non-volatile semiconductor memory element. When a voltage is applied to word line 22, the memory cell applies to bit line 23 a cell current in accordance with a state of the memory cell. Memory cell 21 is a cross-point type configured to dispose a non-volatile semiconductor memory element at the cross point of word line 22 and bit line 23, or has a configuration in which a non-volatile semiconductor memory element and a transistor are connected in series to form one cell, the gate of the transistor is driven using word line 22, and bit line 23 is connected to the source of the transistor or another end of the non-volatile semiconductor memory element.

A variable resistance element, a magnetoresistive element, a phase-change element, or a ferroelectric memory element, which is an element capable of setting any cell current, can be used for the non-volatile semiconductor memory element of memory cell 21.

Word line drive circuit 24 applies a voltage to each word line 22 in accordance with an input of a neural network. Word line drive circuit 24 has a function of concurrently applying a voltage to any ones of word lines 22. Row address signal 41 and setting data 42 are inputted to word line drive circuit 24. A drive state of each word line 22 is set by setting setting data 42 in a position indicated by row address signal 41. Setting data 42 for setting the drive state of each word line 22 has a data width of at least 1 bit. For example, when each word line 22 is represented by a data width of 1 bit, 0 and 1 are assigned to GND level setting and high level setting, respectively. In addition, when word line 22 is represented by a multi-bit, a voltage level of word line 22 is assigned to each data. The word line drive circuit applies a voltage to word line 22 according to the assignment of the voltage level and setting data 42 of each word line 22. Further, the word line drive circuit applies a GND level to word lines 22 other than word line 22 which is indicated by row address signal 41 and to which setting data 42 is set.

Column selection circuit 25 selects, from among bit lines 23, at least one bit line 23 to be used for a neural network computation, based on column selection signal 40 outputted from control circuit 29, and connects at least one bit line 23 to computation circuit 26. At least one computation circuit 26 is included for one memory array 20. When computation circuits 26 are mounted, memory array 20 is divided along the column direction by the number of memory arrays, and computation circuits 26 have respective divided areas in charge. Column selection circuit 25 selects, from each divided area, bit line 23 to be used for a neural network computation, using common column selection signal 40, and connects bit line 23 to each computation circuit 26.

Computation circuit 26 determines a current value flowing in connected bit line 23 to achieve a computation operation of an activation function. It is assumed that the computation circuit in the present invention has a digital value. For example, computation circuit 26 causes a sense amplification circuit to compare the magnitude of two bit lines 23 and outputs binary data of (0, 1), to achieve a computation operation of a step function. Moreover, there is also a method in which an A/D conversion circuit converts a current value flowing in bit line 23 to a digital signal. A result of the computation of the activation function performed by computation circuit 26 is accumulated in output holding circuit 27. Output holding circuit 27 includes a flip-flop, a latch circuit, etc. In Embodiment 1 illustrated in FIG. 5, data accumulated in output holding circuit 27 can be outputted to the outside.

Control circuit 29 refers to network configuration information held in network configuration information holding circuit 28, outputs row address signal 41 to word line drive circuit 24, and indicates a word line area that sets input data or data held in output holding circuit 27. When input data of input layer 1 in a neural network is set, selector circuit 30 selects an external input, and setting data 42 is indicated to word line drive circuit 24. When input data of hidden layer 2 or a subsequent layer is set, selector circuit 30 selects data of output holding circuit 27, and setting data 42 is indicated to word line drive circuit 24. Moreover, control circuit 29 refers to network configuration information, and generates column selection signal 40 that causes column selection circuit 25 to select bit line 23 to be connected to computation circuit 26.

Network configuration information includes the number of nodes of each layer in a neural network, a total number of hidden layers 2, and address information of memory cells 21, to which respective connection weight coefficients are assigned, within memory array 20. FIG. 6 is a diagram illustrating a configuration example of network configuration information. The number of nodes and start addresses for assigning connection weight coefficients are held in a list format. A relationship between start addresses for assigning connection weight coefficients and mapping of connection weight coefficients within memory array 20 will be described in detail later together with an example of operations.

Network configuration information holding circuit 28 is a memory circuit that holds network configuration information. Network configuration information holding circuit 28 includes a random access memory (RAM) so as to rewrite network configuration information. It should be noted that when an access circuit for allowing a portion of memory array 20 to serve as a digital memory is mounted, the portion of memory array 20 may be used as network configuration information holding circuit 28.

The following describes a calculation performed by a neuron according to Embodiment 1.

In the present invention, the respective bias states of word lines 22 correspond to inputs x0 to xn in an equation used by a neuron. Among memory cells 21 selected by same column selection signal 40 and connected to bit lines 23 connected to same computation circuit 26, at least one memory cell 21 driven using same word line 22 expresses one connection weight coefficient.

Hereinafter, an example will be described in which each of inputs $x_0$ to $x_n$ has a binary of (0, 1) and a neuron having a connection weight coefficient expressed by a signed analog value using a difference between cell current values of two memory cells 21 is calculated in Embodiment 1. In addition, a step function is used for an activation function.

Figure 7A:
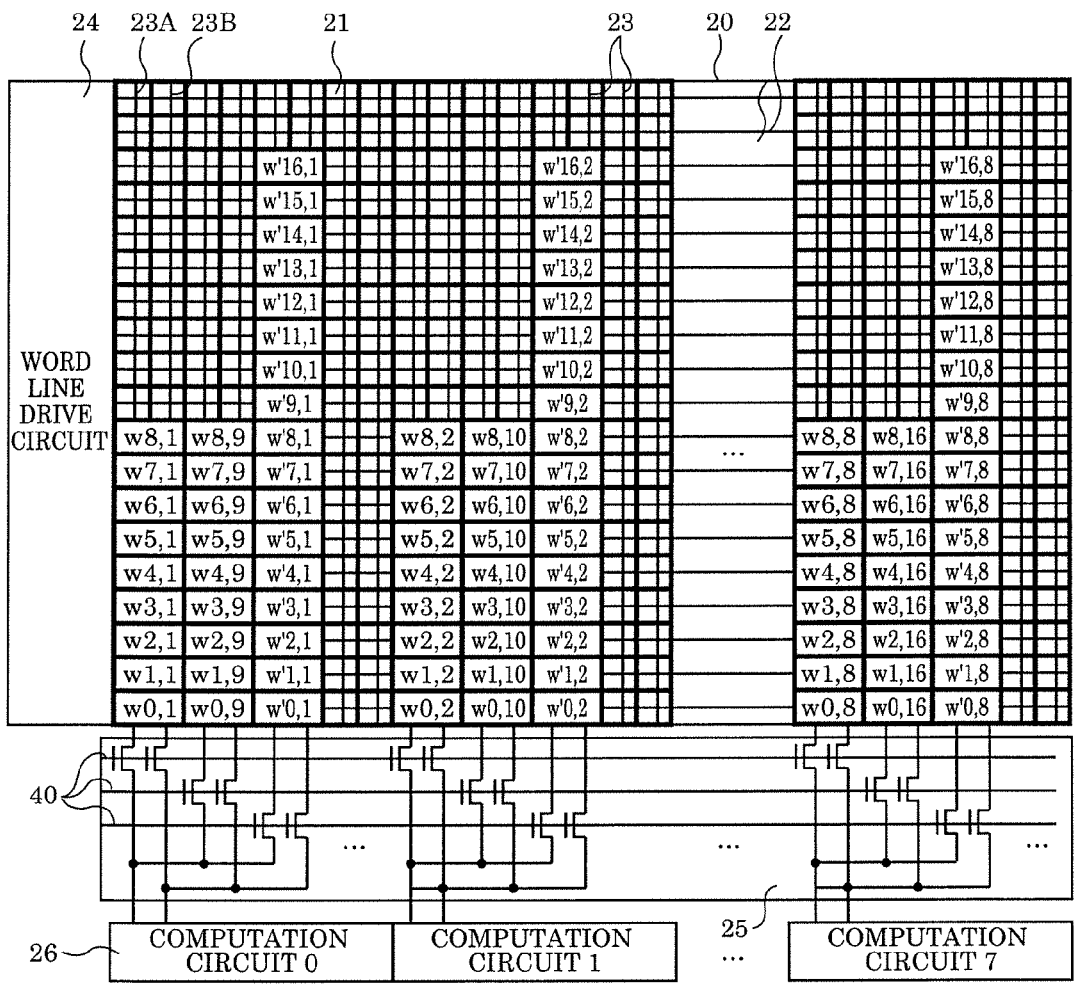
FIG. 7A is a diagram illustrating an example of mapping connection weight coefficient of a neural network and an example of connection of each constituent element.

FIG. 7A is a simplified diagram illustrating memory cells 21, memory array 20, word line drive circuit 24, column selection circuit 25, and computation circuits 26 for use in description. In FIG. 7A, memory array 20 is divided into eight areas along the column direction, and the eight areas correspond one-to-one with computation circuits 26. Column selection circuit 25 selects and connects two bit lines 23 to each computation circuit 26, based on column selection signal 40.

Figure 7B:
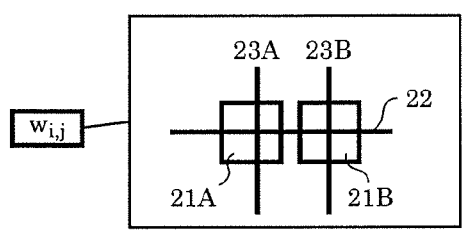
FIG. 7B is a diagram illustrating a connection relationship of memory cell 21 holding one connection weight coefficient $w_{i,j}$.

Among memory cells 21 connected to two bit lines 23 connected to each computation circuit 26 by column selection circuit 25, two memory cells 21 driven using a common word line represents one connection weight coefficient. FIG. 7B illustrates a connection relationship between memory cells 21 holding one connection weight coefficient $w_{i,j}$. In order to set a connection weight coefficient of a signed analog value, one of two memory cells 21 is used as positive-side memory cell 21A for indicating a positive connection weight coefficient, and the other of two memory cells 21 is used as negative-side memory cell 21B for indicating a negative connection weight coefficient. A cell current of positive-side memory cell 21A and a cell current of negative-side memory cell 21B when a high level is applied to word line 22 are set so that a difference between the cell currents is in proportion to a connection weight coefficient. Two bit lines 23 selected by column selection circuit 25 are separated into positive-side bit line 23A connected to positive-side memory cell 21A and negative-side bit line 23B connected to negative-side memory cell 21B. Although, for convenience in writing, positive-side bit line 23A and negative-side bit line 23B are adjacent to each other in the figure, bit lines 23 selected based on common column selection signal 40 can be located anywhere within memory array 20.

Word line drive circuit 24 applies a high-level voltage to word line 22 set to 1, and applies a GND level to word line 22 set to 0, according to (0, 1) data of a set input. A cell current according to a holding state of each cell flows in memory cell 21 connected to word line 22 to which the high-level voltage has been applied. In contrast, a cell current does not flow in memory cell 21 connected to word line 22 having the GND level. For this reason, the current of positive-side memory cell 21A connected to word line 22 that is at a high level flows in positive-side bit line 23A, and the current of negative-side memory cell 21B connected to word line 22 that is at a high level flows in negative-side bit line 23B.

Computation circuit 26 compares the currents of positive-side bit line 23A and negative-side bit line 23B connected thereto. Computation circuit 26 outputs 1 when the current of positive-side bit line 23A is higher, and outputs 0 when the current of negative-side bit line 23B is greater. This operation makes it possible to obtain a result of substituting in the step function the sum of an input represented by a drive state of word line 22 and the connection weight coefficient expressed by a difference between the cell currents of positive-side memory cell 21A and negative-side memory cell 21B.

The following describes a computation operation of a neural network including nodes each of which is the above-described neuron.

Figures 8, 9:
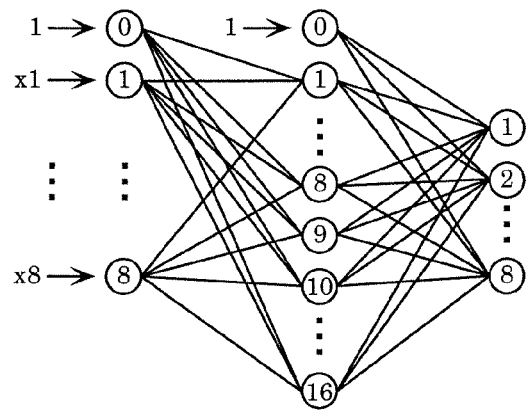
FIG. 8 is a diagram illustrating an example of a neural network used in describing a neural network computation operation in the present invention.
FIG. 9 is a diagram illustrating an example of network configuration information of the neural network illustrated in FIG. 8.

FIG. 8 is a diagram of a neural network for use in description. The neural network has a three-layer structure of input layer 1 including 9 nodes, hidden layer 2 including 17 nodes, and output layer 3 including 8 nodes. Among the nodes of input layer 1 and hidden layer 2, node 0 (hereinafter referred to as a bias node) is used in adding a bias coefficient, and has an input value fixed to 1. External input data $x_1$ to $x_8$ are indicated by (0, 1) data of 8 bits.

FIG. 9 illustrates network configuration information of a neural network for use in description. The first-layer information of the network configuration information indicates that input layer 1 includes 8 nodes except the bias node, that a word line start address for assigning a connection weight coefficient from input layer 1 to hidden layer 2 is number 0, and that a bit line start address is number 0. The second-layer information of the network configuration information indicates that hidden layer 2 includes 16 nodes except the bias node, that a word line start address for assigning a connection weight coefficient from hidden layer 2 to output layer 3 is number 0, and that a bit line start address is number 2. The third-layer information of the network configuration information indicates that output layer 3 includes 8 nodes.

FIG. 7A illustrates a result of mapping connection weight coefficients of the neural network illustrated in FIG. 8 and FIG. 9 into memory array areas. A connection weight coefficient from input layer 1 to hidden layer 2 of the neural network illustrated in FIG. 8 is denoted by $w_{i,j}$, and a connection weight coefficient from hidden layer 2 to output layer 3 is denoted by $w'_{i,j}$. Each i indicates a node number on an input side, and j indicates a node number on an output side. For example, a connection weight coefficient from the bias node (node 0) of input layer 1 illustrated in FIG. 8 to node 1 of hidden layer 2 is denoted by $w_{0,1}$, and a connection weight coefficient from node 1 of hidden layer 2 to node 1 of output layer 3 is denoted by $w'_{1,1}$.

An address within memory array 20 is assigned to each of combinations of word lines 22 and positive-side and negative-side bit lines within divided memory areas. Positions in which $w_{0,1}$ to $w_{0,8}$ are arranged are equivalent to word line address number 0 and bit line address number 0.

As illustrated in FIG. 7A, connection weight coefficients from input layer 1 to hidden layer 2 are separately mapped to $w_{x,1}$ to $w_{x,8}$ (x=0 to 8) equivalent to bit line address number 0 and $w_{x,9}$ to $w_{x,16}$ (x=0 to 8) equivalent to bit line address number 1. In this configuration, connection weight coefficients from a layer to the next layer are mapped to different bit line addresses having a common word line area, when the number of nodes of the next layer exceeds the number of computation circuits. An output node obtained by one computation circuit operation is limited by the number of mounted computation circuits relative to a word line drive state, that is, an input. However, using the above-described mapping method makes it possible to handle the number of output nodes greater than the number of computation circuits by switching column selection signal 40 to cause computation circuit 26 to operate while maintaining a word line drive state.

The mapping of connection weights illustrated in FIG. 7A and the network configuration information illustrated in FIG. 9 indicate the example in which it is assumed that connection weight coefficients from a layer to the next layer are mapped to consecutive bit line addresses, and only a start address for assigning a connection weight coefficient is managed. However, when there is network configuration information or hardware information so that control circuit 29 can specify a position of assigning a connection weight coefficient from a layer to the next layer, connection weight coefficients need not always be mapped to consecutive bit line addresses.

Figure 10:
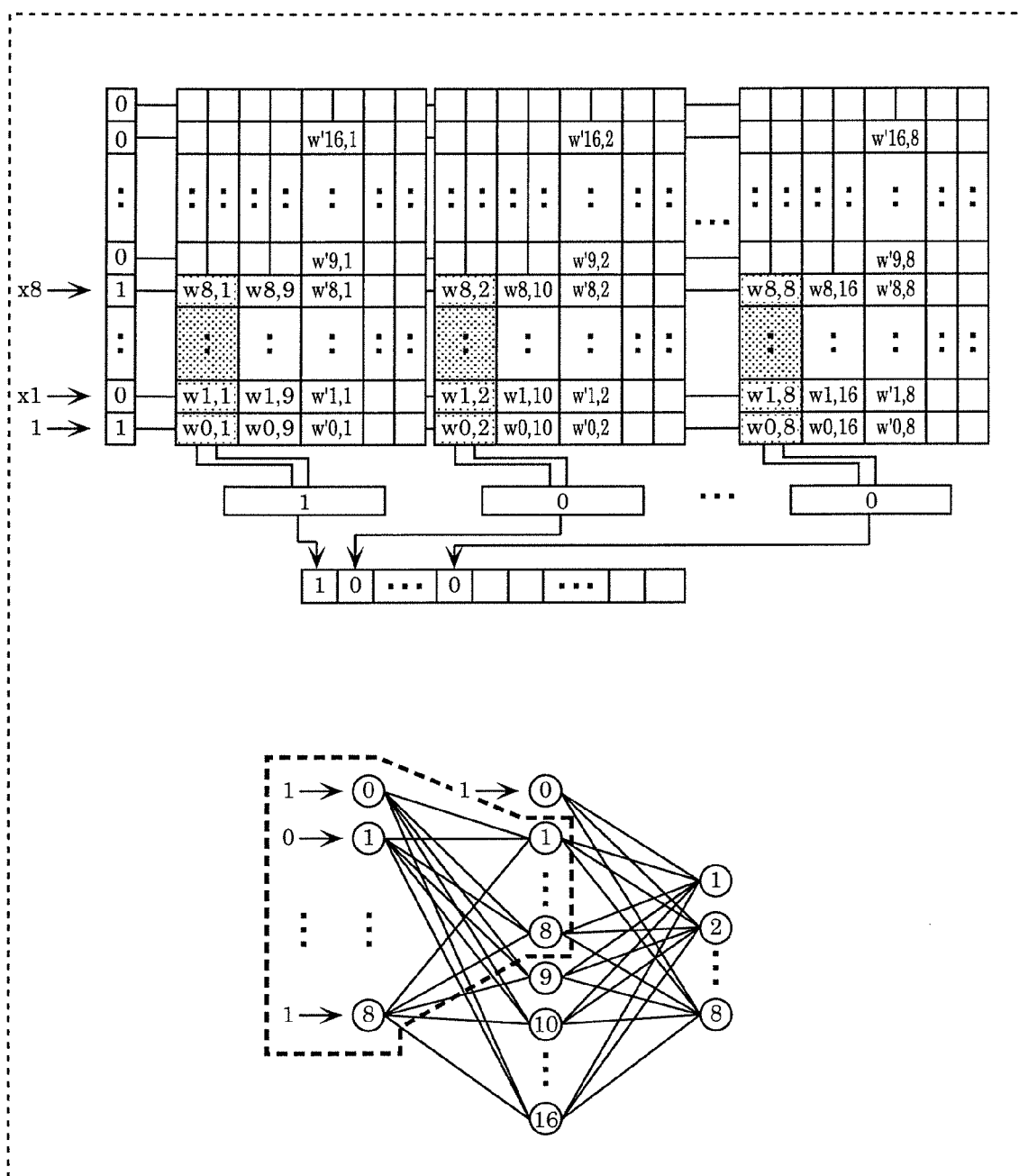
FIG. 10 is a conceptual diagram illustrating an operation of each constituent element when the neural network illustrated in FIG. 8 is computed.

A computation procedure when an input is inputted to the neural network illustrated in FIG. 8 and FIG. 9 will be described with reference to FIG. 10 to FIG. 13. In FIG. 10, first, data of input layer 1 is inputted from the outside, and is set to word line drive circuit 24. At this time, control circuit 29 refers to the first-layer information of the network configuration information illustrated in FIG. 9. It is clear from the first-layer information that input layer 1 includes 8 nodes except the bias node, connection weight coefficients of input layer 1 and the next layer are disposed in word line 22 starting from word line address number 0. Accordingly, 1, an input of the bias node, is set to the word line of word line address number 0, and input data are set to consecutive word line address numbers 1 to 8. It is also clear from the first-layer information that the connection weight coefficients of input layer 1 and the next layer are disposed in a region starting from bit line address number 0. Accordingly, column selection circuit 25 connects positive-side bit line 23A and negative-side bit line 23B indicated by bit line address number 0 to each computation circuit 26. Each of eight computation circuits 26 compares currents of positive-side bit line 23A and negative-side bit line 23B, and outputs (0, 1). The output results are data of node 1 to node 8 of hidden layer 2 and stored in output holding circuit 27.

Figure 11:
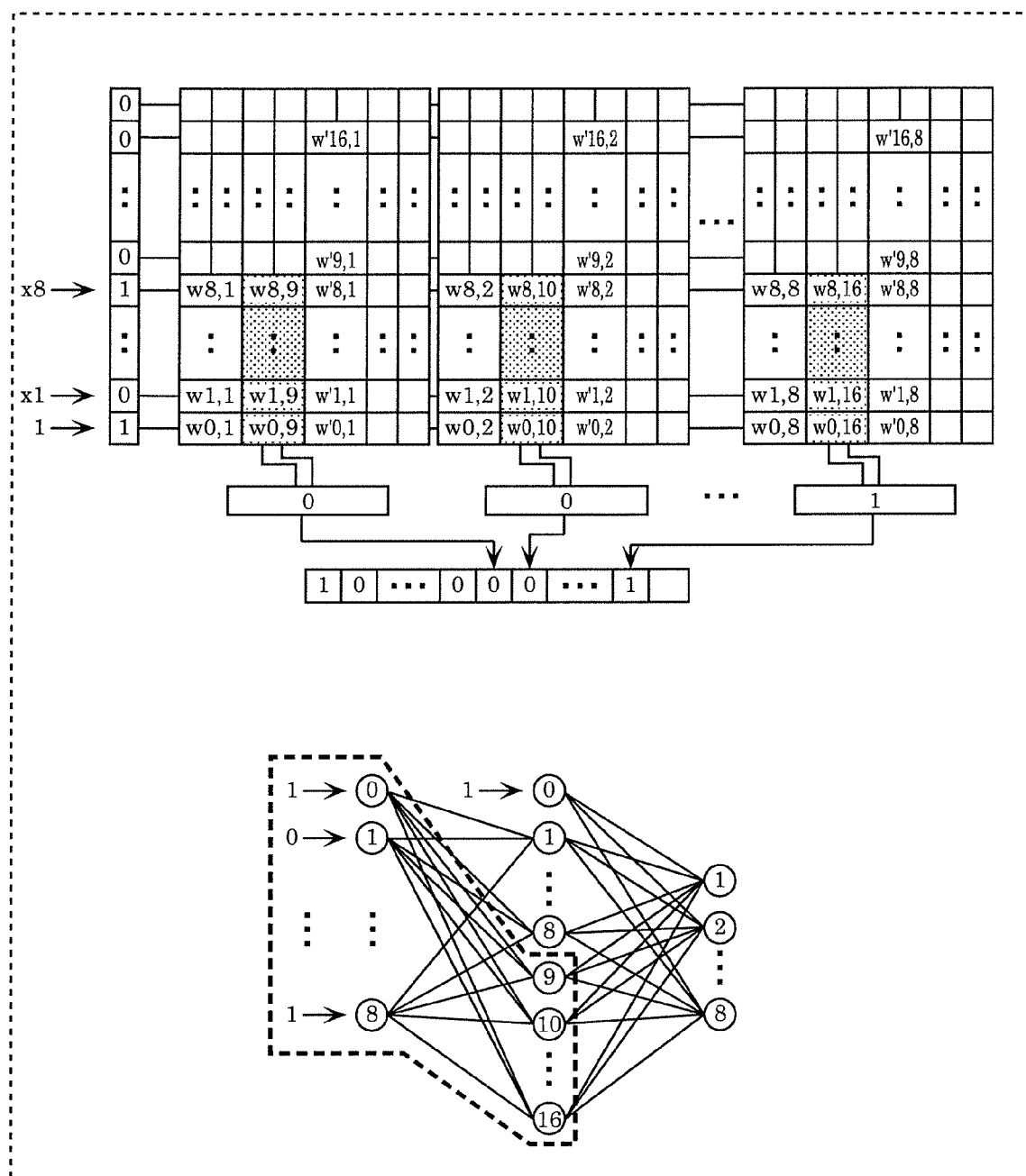
FIG. 11 is a conceptual diagram illustrating an operation of each constituent element when the neural network illustrated in FIG. 8 is computed.

Next, in FIG. 11, it is clear from the second-layer information of the network configuration information that hidden layer 2 includes 16 nodes except the bias node. Since only the computation results of node 1 to node 8 of hidden layer 2 are obtained in the computation operation illustrated in FIG. 10, control circuit 29 increments the bit line address and instructs column selection circuit 25 to select number 1. Column selection circuit 25 connects positive-side bit line 23A and negative-side bit line 23B indicated by bit line address number 1 to each computation circuit 26. Data of node 9 to node 16 of hidden layer 2 can be obtained by computation circuit 26 comparing currents again. Other output results of computation circuits 26 are stored in output holding circuit 27.

Figure 12:
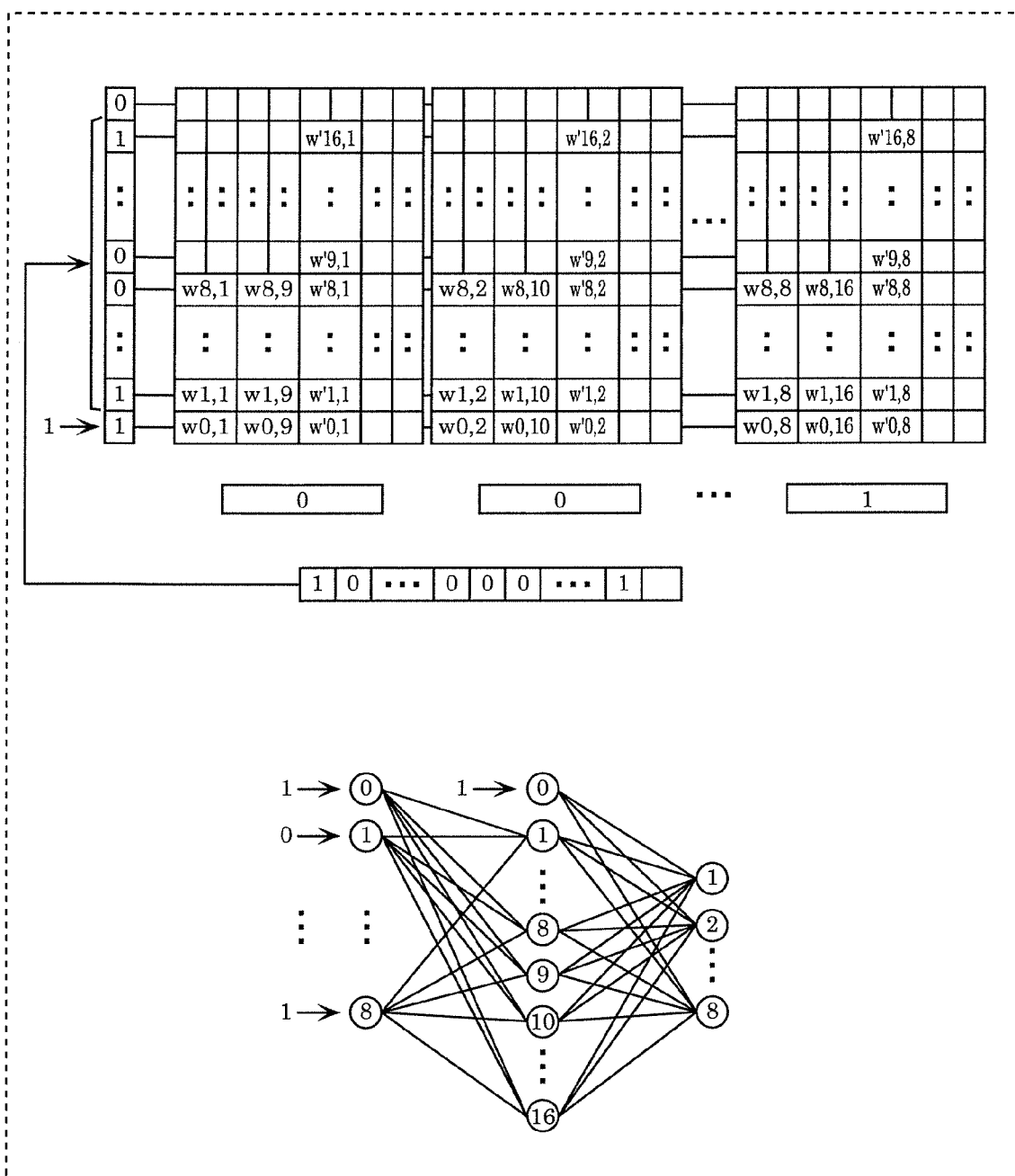
FIG. 12 is a conceptual diagram illustrating an operation of each constituent element when the neural network illustrated in FIG. 8 is computed.

Then, in FIG. 12, since the computation of hidden layer 2 is completed, the data held in output holding circuit 27 is transferred to word line drive circuit 24. It is clear from the second-layer information of the network configuration information that connection weight coefficients of hidden layer 2 and output layer 3 are disposed in word line 22 starting from word line address number 0. Accordingly, 1, an input of the bias node, is set to the word line of word line address number 0, and data of node 1 to node 16 of hidden layer 2 are set to consecutive word line address numbers 1 to 16.

Figure 13:
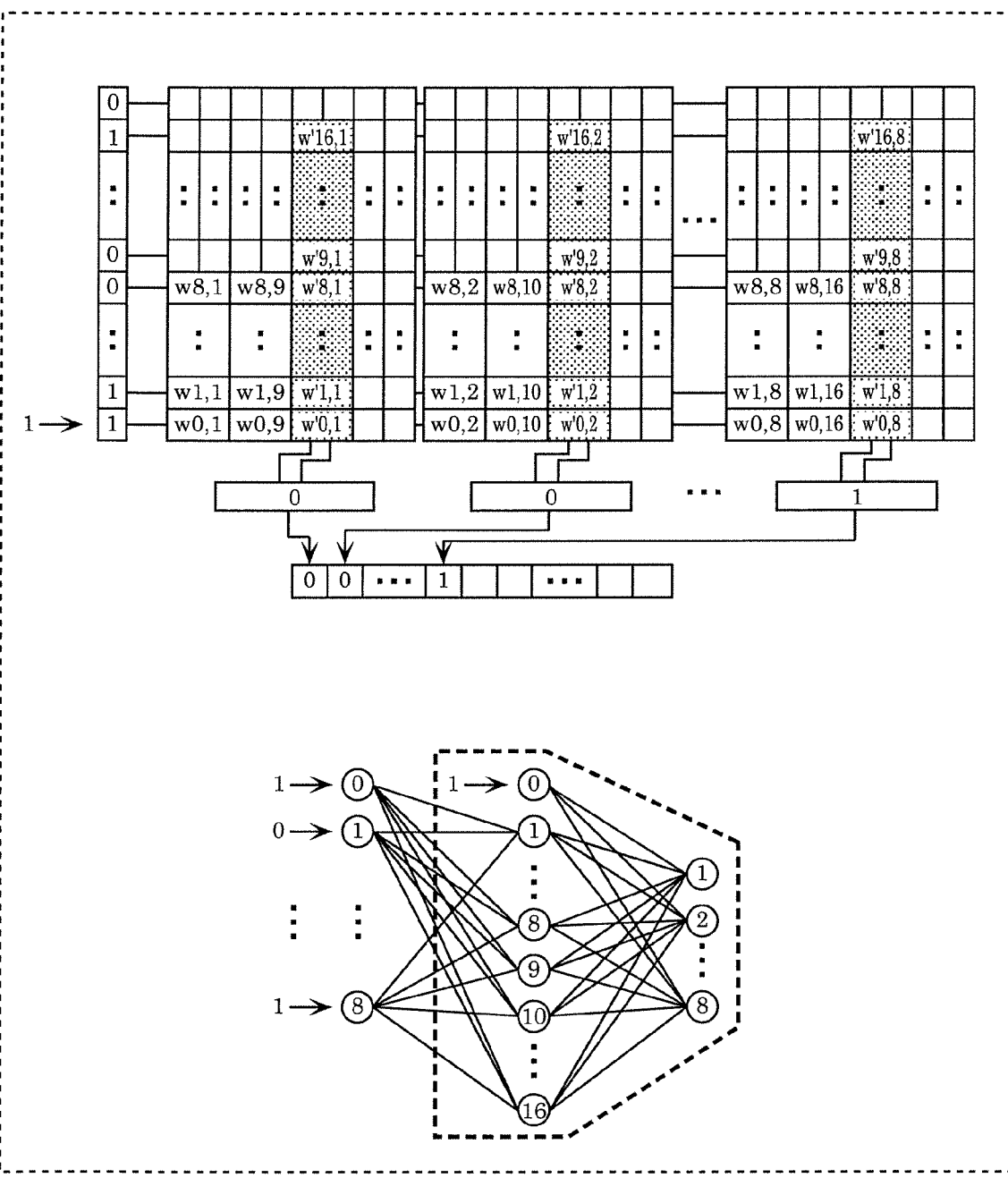
FIG. 13 is a conceptual diagram illustrating an operation of each constituent element when the neural network illustrated in FIG. 8 is computed.

Finally, in FIG. 13, it is clear from the second-layer information of the network configuration information that the connection weight coefficients of hidden layer 2 and output layer 3 are disposed in a region starting from bit line address number 2. Accordingly, column selection circuit 25 connects positive-side bit line 23A and negative-side bit line 23B indicated by bit line address number 2 to each computation circuit 26. Computation circuit 26 compares currents of positive-side bit line 23A and negative-side bit line 23B, and output (0, 1). The output results of computation circuits 26 are stored in output holding circuit 27, and outputted as computation results of output layer 3 to the outside.

With the above-described operation, it is possible to perform the computation of the neural network illustrated in FIG. 8 using the connection weight coefficients held in one memory array 20. When the number of layers of the neural network increases, as stated above, it is also possible to perform the computation by repeating an operation of referring to network configuration information, setting data held in output holding circuit 27 to word line drive circuit 27, selecting bit lines 23, obtaining computation results of computation circuits 26, and storing the computation results in output holding circuit 27.

Figure 14:
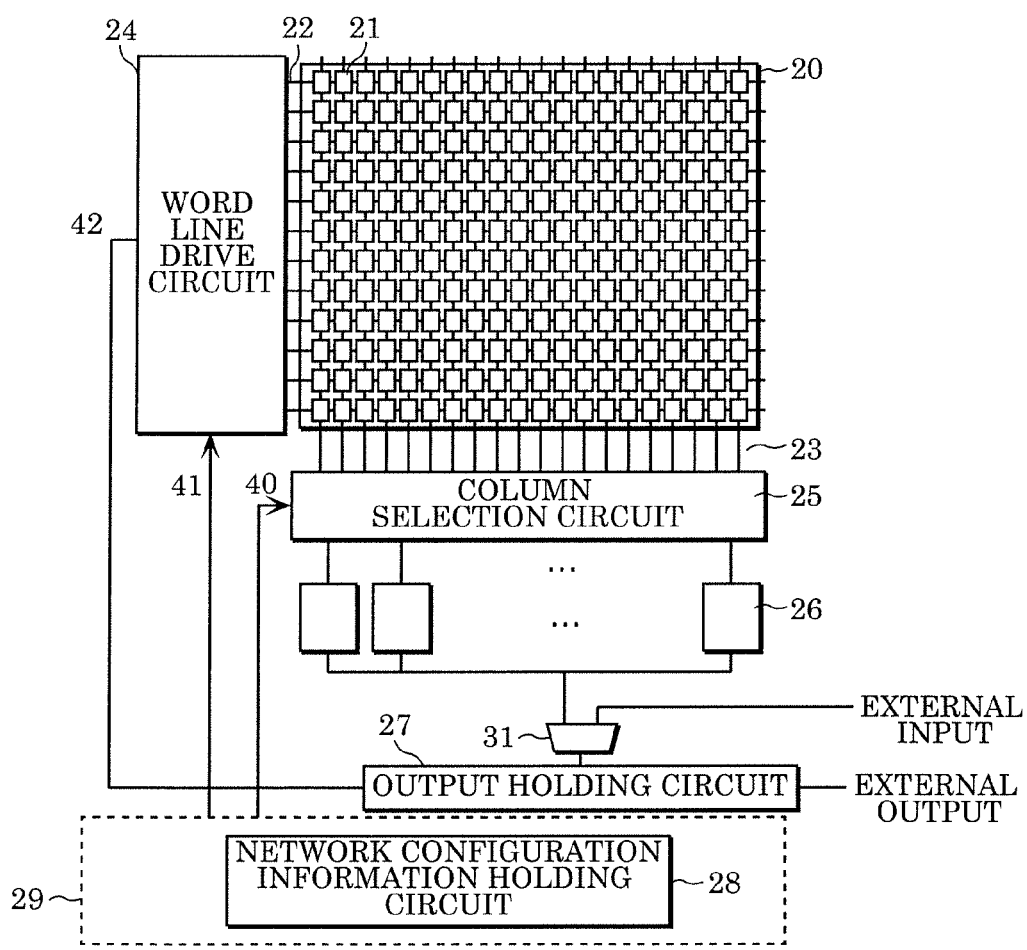
FIG. 14 is a diagram illustrating Embodiment 2 of the present invention.

FIG. 14 is a diagram illustrating a detailed configuration of a neural network computation circuit including a nonvolatile semiconductor memory element according to Embodiment 1 of the present invention. Selector circuit 31 selects an external input and an output of computation circuit 26, and stores the external input and the output in output holding circuit 27. When selector circuit 31 sets input data from the outside, selector circuit 31 temporarily stores the data in output holding circuit 27 and then sets the data to word line drive circuit 24. Further, selector circuit 31 also makes it possible to combine data outputted from computation circuit 26 and data inputted from the outside in output holding circuit 27, and set the combined data to word line drive circuit 24.

Figure 15:
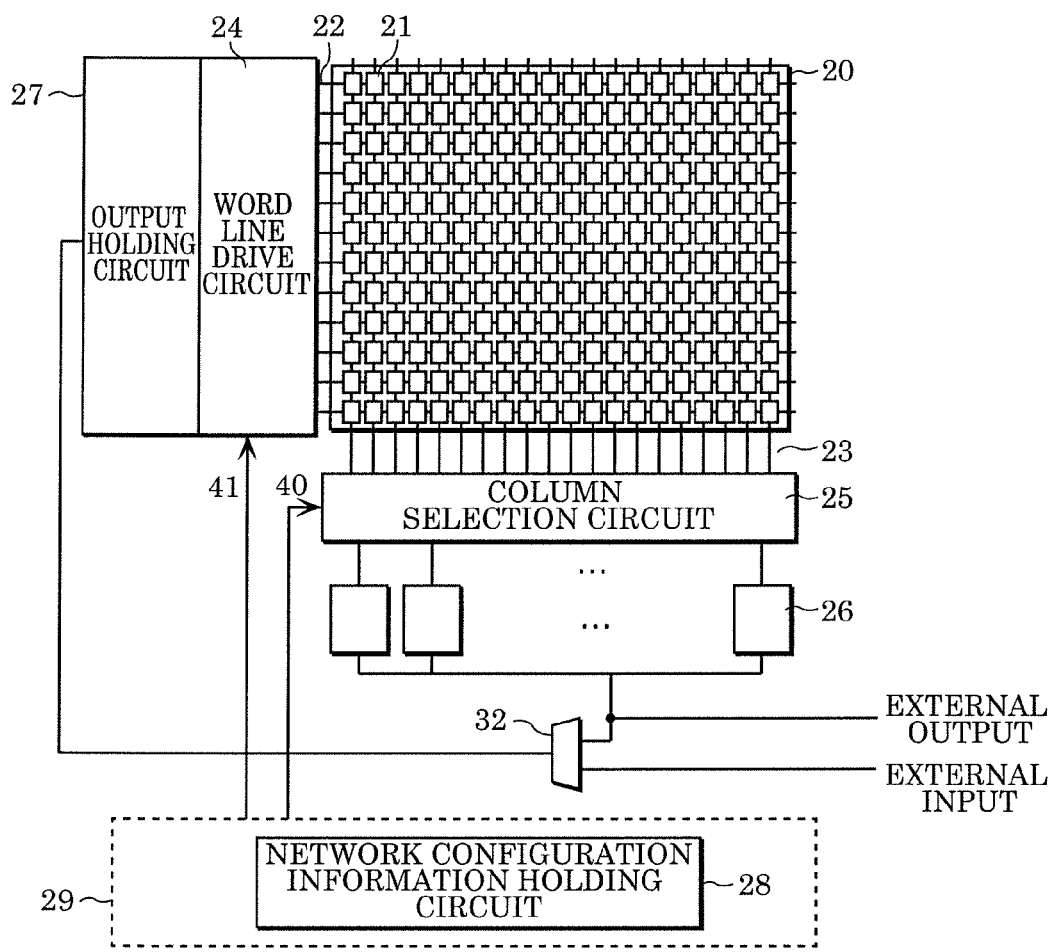
FIG. 15 is a diagram illustrating Embodiment 3 of the present invention.

FIG. 15 is a diagram illustrating a detailed configuration of a neural network computation circuit including a nonvolatile semiconductor memory element according to Embodiment 3 of the present invention. An output of computation circuit 26 is directly connected to an external output, and selector circuit 32 selects the output of computation circuit 26 and an external input, and connects the output and the external input to output holding circuit 27. As with Embodiment 2, when selector circuit 32 sets input data from the outside, selector circuit 32 temporarily stores the data in output holding circuit 27 and then sets the data to word line drive circuit 24. Further, selector circuit 31 also makes it possible to combine data outputted from computation circuit 26 and data inputted from the outside in output holding circuit 27, and set the combined data to word line drive circuit 24.

Although network configuration information holding circuit 28 is illustrated as being included in control circuit 29 in FIG. 5, FIG. 14, and FIG. 15, the mounting location is not limited. In addition, the methods of realizing respective constituent elements and the numbers of the constituent elements mounted in the figures used in describing the embodiments are described as mere examples, and the embodiments are not limited.

It should be noted that the entire surface of memory array 20 in the present invention need not be always used to implement connection weight coefficients of a neural network, and memory array 20 may include an access circuit of a digital memory in addition to the constituent elements of the present invention, so part of memory array 20 can be used as a digital memory. Further, when part of memory array 20 is used as the digital memory, the function of each constituent element can be used for digital memory access.

Although the embodiments of the present invention have been described above, the neural network computation circuit including the non-volatile semiconductor memory element of the present invention is not limited to only the above-described examples. The present invention is effective for embodiments to which various modifications etc. are made without departing from the scope of the present invention.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The neural network computation circuit including the non-volatile semiconductor memory element according to the present invention makes it possible to configure a deep neural network using one memory array, by managing a configuration of a neural network using network configuration information. Moreover, the neural network computation circuit makes it possible to hold neural networks in one memory array by holding connection weight coefficients of the neural networks in different regions of the memory array. Furthermore, since the memory array and the computation circuits are separate in the configuration of the present invention, the memory array can be highly integrated to include many neurons.

In addition, since part of the memory array can be used as a digital memory, the functions of the neural network computation circuit and the digital memory can be concurrently implemented.

Accordingly, the neural network computation circuit can be used practically as a macro performing large-scale neural network computations using one core, and can be also used practically as a macro having the functions of both a neural network computation accelerator and a digital memory. These practical uses are valuable for, for example, a semiconductor integrated circuit equipped with artificial intelligence (AI) technology that performs self-learning and self-determining, and an electronic device including such semiconductor circuits.

What is claimed is:
1. A semiconductor integrated circuit, comprising:
a plurality of word lines;
a plurality of bit lines arranged to cross the plurality of word lines;
a plurality of memory cells that are disposed at cross points of the plurality of word lines and the plurality of bit lines, the plurality of memory cells each holding a connection weight coefficient of a neural network;
a word line drive circuit for driving at least one of the plurality of word lines;
a column selection circuit for selecting a bit line from among the plurality of bit lines;
a computation circuit that determines a current flowing in the bit line selected by the column selection circuit, to perform a multiply-accumulate operation between the connection weight coefficients held in the plurality of memory cells connected to the bit line selected by the column selection circuit and input data indicated by drive states of the plurality of word lines;
an output holding circuit that holds output data of the computation circuit;
a network configuration information holding circuit that holds network configuration information that is rewriteable and includes a total number of nodes in each layer of the neural network, a total number of hidden layers, and address information of each memory cell to which the connection weight coefficient of the neural network is assigned, the network configuration information being information for managing a configuration of the neural network; and
a control circuit having a function of setting to the word line drive circuit input data from an outside based on the network configuration information, a function of setting to the word line drive circuit data held in the output holding circuit, based on the network configuration information, and a function of specifying to the column selection circuit a bit line to be used for a computation, based on the network configuration information, wherein:
the control circuit sets, as input data of a next layer, a computation result of a layer to the word line drive circuit again, by managing an arrangement of the connection weight coefficients of the plurality of memory cells using the network configuration information, and
the control circuit rewrites the network configuration information.

2. The semiconductor integrated circuit according to claim 1,
wherein the semiconductor integrated circuit has a function of, after storing output data of the computation circuit in the output holding circuit in a word line drive state and a bit line selection state, changing a bit line to be selected while maintaining the word line drive state, storing another output data of the computation circuit in the output holding circuit, and setting combined data to the word line drive circuit.

3. The semiconductor integrated circuit according to claim 1, further comprising:
a selector circuit that selects data to be connected to the word line drive circuit, based on the input data from the outside and the data held in the output holding circuit.

4. The semiconductor integrated circuit according to claim 1, further comprising:
a selector circuit that selects data to be connected to the word line drive circuit, based on the input data from the outside and the output data of the computation circuit.

5. A method of operation for a neural network semiconductor integrated circuit,
the method comprising the following performed using a semiconductor integrated circuit including: a plurality of word lines; a plurality of bit lines arranged to cross the plurality of word lines; a plurality of memory cells disposed at cross points of the plurality of word lines and the plurality of bit lines, the plurality of memory cells each holding a connection weight coefficient of a neural network; a word line drive circuit for driving at least one of the plurality of word lines; a column selection circuit for selecting a bit line from among the plurality of bit lines; a computation circuit that determines a current flowing in the bit line selected by the column selection circuit, to perform a multiply-accumulate operation between the connection weight coefficients held in the plurality of memory cells connected to the bit line selected by the column selection circuit and input data indicated by drive states of the plurality of word lines; an output holding circuit that holds output data of the computation circuit; a network configuration information holding circuit that holds network configuration information that is rewriteable and includes a total number of nodes in each layer of the neural network, a total number of hidden layers, and address information of each memory cell to which the connection weight coefficient of the neural network is assigned, the network configuration information being information for managing a configuration of the neural network; and a control circuit having a function of setting to the word line drive circuit input data from the outside based on the network configuration information, a function of setting to the word line drive circuit data held in the output holding circuit, based on the network configuration information, and a function of specifying to the column selection circuit a bit line to be used for a computation, based on the network configuration information:

setting the input data from an outside based on the network configuration information so that a first word line area corresponding to first memory cells is driven, selecting at least one first bit line corresponding to the first memory cells, and connecting the at least one first bit line to the computation circuit, the first memory cells holding connection weight coefficients of an input layer and a first hidden layer of the neural network, the first hidden layer being a next layer of the input layer;

holding a computational result from the computation circuit in the output holding circuit, setting, as input data of a second hidden layer, the data held in the output holding circuit so that a second word line area corresponding to second memory cells is driven, selecting at least one second bit line corresponding to the second memory cells, and connecting the at least one second bit line to the computation circuit, the second hidden layer being a next layer of the first hidden layer, the second memory cells holding connection weight coefficients of the first hidden layer and the second hidden layer;

holding a computational result from the computation circuit in the output holding circuit, and when an output of the computation circuit is not transmitted to an output layer, further repeating an operation identical to an operation performed on the second hidden layer, using memory cells corresponding to a next hidden layer;

settings, as input data of a next layer, a computation result of a layer to the word line drive circuit again, by managing an arrangement of the connection weight coefficients of the plurality of memory cells using the network configuration information, and rewriting the network configuration information.

6. The method according to claim 5, further comprising:
repeating an operation of selecting the at least one first bit line or the at least one second bit line, connecting the at least one first bit line or the at least one second bit line to the computation circuit, and holding a computational result from the computation circuit in the output holding circuit, while changing a selected bit line until all computational results of nodes in a next layer are obtained.

* * * * *